(12) United States Patent
Choi et al.

(10) Patent No.: US 9,002,487 B2
(45) Date of Patent: Apr. 7, 2015

(54) SYSTEM AND METHOD FOR DATA RECEPTION AND TRANSMISSION IN AUDIBLE FREQUENCY BAND

(75) Inventors: Keun Hwan Choi, Seoul (KR); Moon Kee Kim, Gyeonggi-Do (KR); Myung Soon Park, Seoul (KR); Min Seok Kim, Seoul (KR); Nam Soo Kim, Seoul (KR); Hwan Sik Yun, Seoul (KR); Ki Ho Cho, Gyeonggi-Do (KR)

(73) Assignees: SK Telecom Co., Ltd. (KR); Seoul National University R&DB Foundation (KR)

( * ) Notice: Subject to any disclaimer, the term of this patent is extended or adjusted under 35 U.S.C. 154(b) by 849 days.

(21) Appl. No.: 12/737,770

(22) PCT Filed: Jul. 8, 2009

(86) PCT No.: PCT/KR2009/003725
§ 371 (c)(1),
(2), (4) Date: Feb. 14, 2011

(87) PCT Pub. No.: WO2010/018929
PCT Pub. Date: Feb. 18, 2010

(65) Prior Publication Data
US 2011/0134971 A1    Jun. 9, 2011

(30) Foreign Application Priority Data

Aug. 14, 2008  (KR) .................. 10-2008-0080185
Aug. 14, 2008  (KR) .................. 10-2008-0080188

(51) Int. Cl.
*G06F 17/00*    (2006.01)
*H04K 1/02*    (2006.01)
(Continued)

(52) U.S. Cl.
CPC ......... *G11B 20/00891* (2013.01); *H04H 20/31* (2013.01); *H04K 1/02* (2013.01); *H04B 10/114* (2013.01); *H03G 1/02* (2013.01); *G10L 19/018* (2013.01)

(58) Field of Classification Search
CPC ............. H04R 2420/07; H04B 10/114; H04B 10/1141; H04S 7/00; H04S 7/30; H04K 1/02; H04N 1/00962; H04N 21/4394; H03G 1/02; G10L 19/018; G11B 20/00891; G11B 20/00913; G06F 17/30749; G06F 17/30752; H04H 20/31; H04H 20/86; G08C 17/00; G08C 14/02; G08C 23/04
USPC ......... 700/94; 380/253, 236, 237; 381/77, 79, 381/80, 311
See application file for complete search history.

(56) References Cited

U.S. PATENT DOCUMENTS 5,764,763 A * 6/1998 Jensen et al. .................. 380/253
6,275,545 B1 * 8/2001 Suzuki ........................... 375/343
(Continued)

FOREIGN PATENT DOCUMENTS

JP    2000-106627    4/2000
(Continued)

Primary Examiner — Jesse Elbin
(74) Attorney, Agent, or Firm — Baker Hostetler LLP (57) ABSTRACT

Disclosed are a system and a method for transceiving data in an audio frequency band. The system includes a data input unit to input data for acoustic communication into an audio signal, a transmitting unit to transmit the audio signal including the data in the audio frequency band, and a receiving unit that receives the audio signal including the data and performs synchronization of the audio signal through a matched filtering using a matched filter in order to extract the data according to predetermined extraction processing. The data to be transmitted are added to an audio signal and the audio signal is transmitted in the audio frequency band, so that the data for the acoustic communication are effectively transmitted to the recipient in the audio frequency band.

9 Claims, 9 Drawing Sheets

(51) Int. Cl.
  *H04R 5/02* (2006.01)
  *G11B 20/00* (2006.01)
  *H04H 20/31* (2008.01)
  *G10L 19/018* (2013.01)
  *H04B 10/114* (2013.01)
  *H03G 1/02* (2006.01)

(56) References Cited

U.S. PATENT DOCUMENTS

2005/0152549 A1* 7/2005 Lemma et al. ............... 380/255
2007/0136595 A1* 6/2007 Baum et al. ................. 713/176
2007/0189533 A1* 8/2007 Rhoads ........................ 380/247

FOREIGN PATENT DOCUMENTS

| | | |
|---|---|---|
| JP | 2000-224046 | 8/2000 |
| JP | 2007-017900 | 1/2007 |
| JP | 2007-317175 | 12/2007 |
| KR | 1020020031654 | 5/2002 |
| KR | 1020050002545 | 1/2005 |
| KR | 1020060005494 | 1/2006 |
| KR | 1020070067501 | 6/2007 |
| KR | 1020080029446 | 4/2008 |
| WO | 01/31629 | 5/2001 |
| WO | 2008/038852 | 4/2008 |

* cited by examiner

SYSTEM AND METHOD FOR DATA RECEPTION AND TRANSMISSION IN AUDIBLE FREQUENCY BAND

TECHNICAL FIELD

The present invention relates to technology for transceiving data in an audio frequency band. More particularly, the present invention relates to a system and a method for transceiving data in an audio frequency band, in which data to be transmitted are added an audio signal and the audio signal is transmitted in the audio frequency band, thereby realizing the acoustic communication in the audio frequency band.

BACKGROUND ART

An analog type audio signal transmission scheme is mainly used to transmit audio signals. According to the analog type audio signal transmission scheme, a transmission signal is generated by modulating the frequency of infrared rays using an analog audio signal and the transmission signal is spatially transmitted. For instance, such an analog type audio signal transmission scheme can be employed to transmit audio signals between a CD player and a speaker.

However, since the analog type audio signal transmission scheme requires modulation of the frequency of the infrared rays using an analog audio signal, sound quality may be degraded during signal transmission.

In addition, according to the analog type audio signal transmission scheme, it may be difficult to add a digital type control signal, which is used to adjust sound quality between the analog type audio signal and audio equipment, to the transmission signal, so the control signal must be transmitted separately from the audio signal.

To solve the above problem, an audio signal transmitting apparatus has been developed to optically transmit digital type audio signals, which are rarely degraded in the transmission path, and studies and research have been actively conducted to effectively transmit audio signals without degrading the sound quality of the audio signals.

Meanwhile, studies and research have been further conducted to transmit the audio signal to a recipient by adding specific data to the audio signal. However, there are various problems in that the audio signal may be distorted as the data are added to the audio signal and it may be difficult to effectively add the data to the audio signal and to detect the added data at the recipient, so such a data addition scheme represents a limitation in realizing the acoustic communication in an audio frequency band. Accordingly, technologies capable of solving the above problems are required.

DISCLOSURE

Technical Problem

The present invention has been made to solve the above problems occurring in the prior art, and an object of the present invention is to provide a system and a method for transceiving data in an audio frequency band, capable of realizing acoustic communication in the audio frequency band by adding data to be transmitted to an audio signal and transmitting the audio signal in the audio frequency band.

Another object of the present invention is to provide a system and a method for transceiving data in an audio frequency band, capable of minimizing distortion of an audio signal such that a person may not recognize the acoustic communication performed in the audio frequency band.

Yet another object of the present invention is to provide a system and a method for transceiving data in an audio frequency band, capable of effectively adding data for the acoustic communication to an audio signal by taking the audio frequency band into consideration and allowing a recipient to easily detect the data from the audio signal including the data.

Technical Solution

To accomplish the above objects, according to one aspect of the present invention, there is provided a system for transceiving data in an audio frequency band. The system includes a data input unit to input data for acoustic communication into an audio signal, a transmitting unit to transmit the audio signal including the data in the audio frequency band, and a receiving unit that receives the audio signal including the data and performs synchronization of the audio signal through a matched filtering, extracts the data according to predetermined extraction processing.

According to the exemplary embodiment of the present invention, the transmitting unit receives the audio signal including the data through a communication network to transmit the audio signal to the receiving unit, or receives the audio signal including the data through a storage medium to transmit the audio signal to the receiving unit.

According to another aspect of the present invention, there is provided a data input apparatus including a frequency-axis transform part for transforming a time-axis signal of an audio signal into a frequency-axis signal of the audio signal, a frequency conversion part that selects a frequency band to input data for acoustic communication based on the frequency-axis signal and converts a subject frequency corresponding to the frequency band to input the data according to formation of the data, and a time-axis inverse transform part to inversely transform the frequency-axis signal into the time-axis signal to generate the audio signal including the data.

According to the exemplary embodiment of the present invention, the data input apparatus further includes a transmitting part for transmitting the audio signal including the data in the audio frequency band.

The frequency conversion unit performs data input by re-inputting a value corresponding to a level and a phase of a transform coefficient of the subject frequency according to formation of the data.

The frequency conversion part re-adjusts the level of the transform coefficient of the subject frequency based on a frequency signal boundary defined by power intensity of subject frequencies to reduce distortion of the audio signal below a predetermined level.

The frequency conversion part re-adjusts the level of the transform coefficient of the subject frequency based on a masking threshold value, which is preset based on a psychoacoustic model.

The frequency conversion part further inputs data for synchronization to facilitate data detection.

The frequency-axis transform part transforms a first section of the time-axis signal into the frequency-axis signal, transforms a second section, which overlaps with the first section by a predetermined level, into the frequency-axis signal, and then transforms an $N^{th}$ section, which overlaps with the second section by a predetermined level, into the frequency-axis signal.

The frequency conversion part inputs the data based on the frequency-axis signal corresponding to the first section, inputs the data based on the frequency-axis signal corresponding to the second section, and then inputs the data based on the frequency-axis signal corresponding to the $N^{th}$ section.

The time-axis inverse transform part inversely transforms the frequency-axis signal corresponding to the first section into the time-axis signal, inversely transforms the frequency-axis signal corresponding to the second section into the time-axis signal, and then inversely transforms the frequency-axis signal corresponding to the $N^{th}$ section into the time-axis signal in such a manner that the sections of the signal are overlapped with each other, thereby generating the audio signal including the data.

According to yet another aspect of the present invention, there is provided a data transmitting apparatus for acoustic communication. The data transmitting apparatus includes a frequency-axis transform part for transforming a time-axis signal of an audio signal into a frequency-axis signal, a frequency band selection part, which establishes a group section having a predetermined frequency range based on the frequency-axis signal and selects a frequency band to input data for acoustic communication according to a band selection reference including a level of power intensity of the group section, a frequency conversion part which converts a subject frequency corresponding to the frequency band according to formation of the data if the frequency band to input the data is selected, and a time-axis inverse transform part for inversely transforming the frequency-axis signal into the time-axis signal to generate the audio signal including the data.

According to the exemplary embodiment of the present invention, the data transmitting apparatus further includes a signal output part for transmitting the audio signal including the data in the audio frequency band.

According to the exemplary embodiment of the present invention, the data transmitting apparatus further includes a time section selection part to select sections for inputting the data with respect to the time-axis signal of the audio signal, which is input after a predetermined time has elapsed, when the section to input the data is not selected.

The group section includes at least one frequency group including frequencies having continuous or discontinuous frequency coefficients.

The frequency group including the discontinuous frequency coefficients is filtered to have predetermined frequency components with a predetermined level.

The frequency band selection part primarily selects a highest frequency group from among the frequency groups to determine whether the highest frequency group satisfies the band selection reference, or the frequency band selection part detects whether each frequency group satisfies the band selection reference.

The frequency band selection part calculates total power intensity of each frequency group and determines the frequency group satisfying the band selection reference based on the calculation result to select the frequency band to input the data.

The frequency band selection part calculates power intensity of each frequency of the frequency group and determines at least one frequency satisfying the band selection reference based on the calculation result to set the at least one frequency as the frequency band to input the data.

According to yet another aspect of the present invention, there is provided a data receiving apparatus for acoustic communication. The data receiving apparatus includes a synchronization part receiving an audio signal including data to perform synchronization through a matched filtering, a time section selection part to select a time section including the data from among time sections of the synchronized audio signal, a frequency-axis transform part to transform a time-axis signal of the time section including the data into a frequency-axis signal, and a data extracting part which selects a frequency band for data extraction based on the frequency-axis signal and extracts the data through predetermined data extraction processing.

According to the exemplary embodiment of the present invention, the data receiving apparatus further includes a program execution part to execute application programs corresponding to the data.

The time section selection part selects the time section including the data by extracting synchronization data from the audio signal including the data and detecting an insertion position of the synchronization data.

The synchronization data are located at a start frame of the time section including the data or located corresponding to at least two grouped start frames.

The time section selection part separately receives guide information for the time section including the data to determine the time section including the data.

The time section selection part receives the guide information through a communication channel used to receive the audio signal including the data, or another communication channel different from the communication channel used to receive the audio signal including the data.

The data extraction part selects the frequency band for the data extraction by extracting synchronization data from the audio signal including the data and detecting an insertion position of the synchronization data.

The data extraction part separately receives guide information for the data extraction to determine the frequency band including the data.

The data extraction part determines a phase of a plurality of subject frequencies constituting the frequency-axis signal, and selects the subject frequency having the phase corresponding to a preset phase as the frequency band for the data extraction.

According to yet another aspect of the present invention, there is provided a method of transceiving data for acoustic communication. The method includes the steps of inputting data for acoustic communication into an audio signal, transmitting the audio signal including the data in an audio frequency band, receiving the audio signal including the data to perform synchronization through a matched filtering, and extracting the data according to predetermined data extraction processing.

According to the exemplary embodiment of the present invention, the method further includes a step of executing an application program corresponding to the data.

The data input step includes the steps of transforming a time-axis signal of the audio signal into a frequency-axis signal, selecting a frequency band to input the data based on the frequency-axis signal, converting a subject frequency corresponding to the frequency band to input the data according to formation of the data, and inversely transforming the frequency-axis signal into the time-axis signal to generate the audio signal including the data.

According to yet another aspect of the present invention, there is provided a method of transmitting data for acoustic communication. The method includes the steps of transforming a time-axis signal of an audio signal into a frequency-axis signal, establishing a group section having a predetermined frequency range based on the frequency-axis signal and selecting a frequency band to input data for the acoustic communication according to a band selection reference including a level of power intensity of the group section, converting a subject frequency corresponding to the frequency band according to formation of the data if the frequency band to input the data is selected, and inversely transforming the frequency-axis signal into the time-axis signal to generate the audio signal including the data.

According to the exemplary embodiment of the present invention, the method further includes a step of transmitting the audio signal including the data in an audio frequency band.

According to the exemplary embodiment of the present invention, the method further includes a step of selecting sections for inputting the data with respect to the time-axis signal of the audio signal, which is input after a predetermined time has elapsed, when the section to input the data is not selected.

According to yet another aspect of the present invention, there is provided a method of receiving data for acoustic communication. The method includes the steps of receiving an audio signal including data to perform synchronization through a matched filtering, selecting a time section including the data from among time sections of the synchronized audio signal, transforming a time-axis signal of the time section including the data into a frequency-axis signal, and selecting a frequency band for data extraction based on the frequency-axis signal and extracting the data through predetermined data extraction processing.

According to the exemplary embodiment of the present invention, the method further includes a step of executing application programs corresponding to the data.

Advantageous Effects

According to the present invention, the audio signal is transmitted in the audio frequency band after data to be transmitted have been added to the audio signal, so that the data for the acoustic communication can be effectively transmitted to the recipient in the audio frequency band.

In addition, according to the present invention, the data are added to the audio signal by taking the audio frequency band into consideration, so that noise, which is generated when the data are added to the audio signal, can be minimized to the extent that a person cannot recognize the noise, and errors can be reduced when the data are input into or detected from the audio signal.

Further, the function of the transmitter for inputting data into the audio signal or the function of the recipient for detecting the data from the audio signal can be reinforced, so that the range of the audio signals adapted for the acoustic communication can be expanded, resulting in the development of the acoustic communication.

BEST MODE FOR INVENTION

Hereinafter, a data transceiving system according to the exemplary embodiments of the present invention will be described in detail with reference to accompanying drawings.

Figure 1:
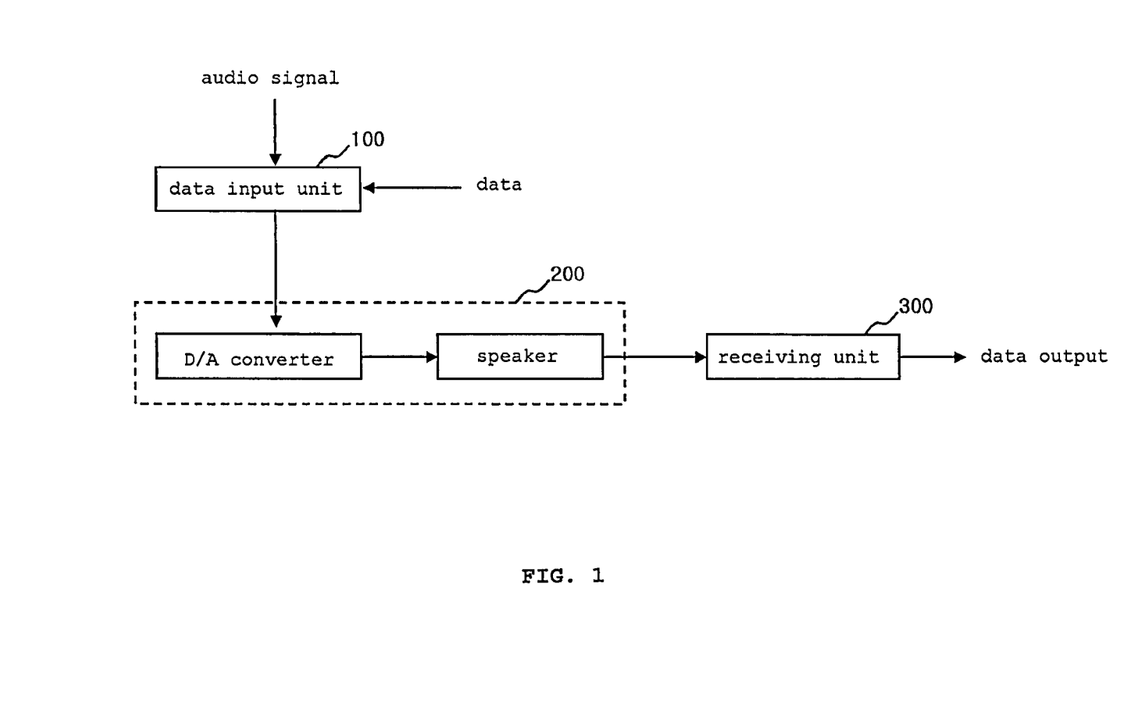
FIG. 1 is a block view showing a data transceiving system in the audio frequency band according to one embodiment of the present invention.

FIG. 1 is a block view showing the data transceiving system in the audio frequency band according to one embodiment of the present invention. As shown in FIG. 1, the data transceiving system in the audio frequency band includes a data input unit 100 to input data for the acoustic communication into several sections of an audio signal, a transmitting unit 200 for transmitting the audio signal including the data in the audio frequency band, and a receiving unit 300 that receives the audio signals including the data and executes the synchronization of the audio signals by performing the matched filtering using a matched filter in order to extract the data from data input sections, which are selected through the synchronization, according to the predetermined extraction processing.

The data input unit 100 may be integrally formed with the transmitting unit 200 or may be separated from the transmitting unit 200. If the data input unit 100 is integrally formed with the transmitting unit 200, it is suitable for transmitting the audio signal including the data through the radio broadcasting. If the data input unit 100 is separated from the transmitting unit 200, it is suitable for reproducing the storage medium storing the audio signal including the data through the audio system installed in the vehicle.

Figure 2:
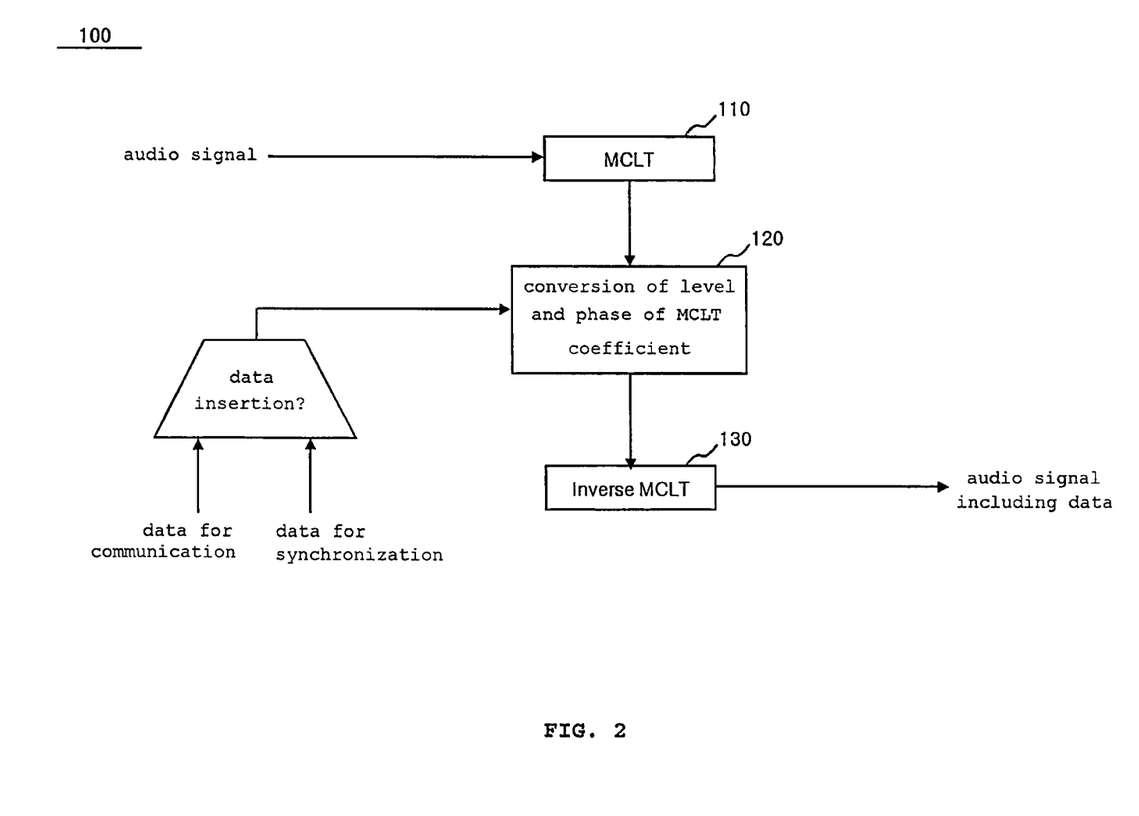
FIG. 2 is a block view showing an execution procedure of a data input unit shown in FIG. 1.

FIG. 2 is a block view showing the execution procedure of the data input unit 100 shown in FIG. 1. As shown in FIG. 2, the data input unit 100 includes a frequency-axis transform part 110 for transforming a time-axis signal of the audio signal into a frequency-axis signal of the audio signal using a transform tool, such as MCLT (modified complex lapped transform), a frequency conversion part 120 that selects the frequency band to input the data for the acoustic communication based on the frequency-axis signal and inputs the data upon the re-input of a value corresponding to a level and a phase of the transform coefficient resulted from the MCLT with respect to the subject frequency corresponding to the frequency band to input the data, and a time-axis inverse transform part 130 to inversely transform the frequency-axis signal into the time-axis signal to generate the audio signal including the data.

The audio signal including the data is transmitted in the audio frequency band through the transmitting unit 200.

Preferably, the frequency conversion part 120 may further input data for synchronization in such a manner that the receiving unit 300 can easily detect the data included in the audio signal.

The frequency conversion part 120 inputs the data by converting the level and the phase of the transform coefficient for the subject frequency. The M-ary PSK method can be employed to convert the transform coefficient (in the case of MCLT, MCLT transform coefficient) and various methods generally known in the art can also be employed.

For instance, Binary PSK converts the phase to 0 to transmit 0 and converts the phase to π to transmit 1, thereby classifying the data.

Preferably, the data input unit 100 selects several frequency sections of the original audio signal to input the data (for instance, the frequency sections can be selected by using power intensity suitable for transmitting the data) and readjusts the level of the transform coefficient of an OFDM signal of the data to be input based on the frequency signal boundary defined by power intensity of subject frequencies in the selected frequency sections, thereby reducing the distortion of the audio signal below a predetermined level.

The level of the transform coefficient can be adjusted based on a masking threshold value, which is predetermined as a limit value based on the psychoacoustic model. If a signal has a level lower than the masking threshold value, the signal is not audible to people. Therefore, if the level of the transform coefficient is lower than the masking threshold value, the intensity of the signal is amplified to the extent of the masking threshold value in such a manner that the noise may not be audible to people and the acoustic communication performance can be improved.

Figure 3:
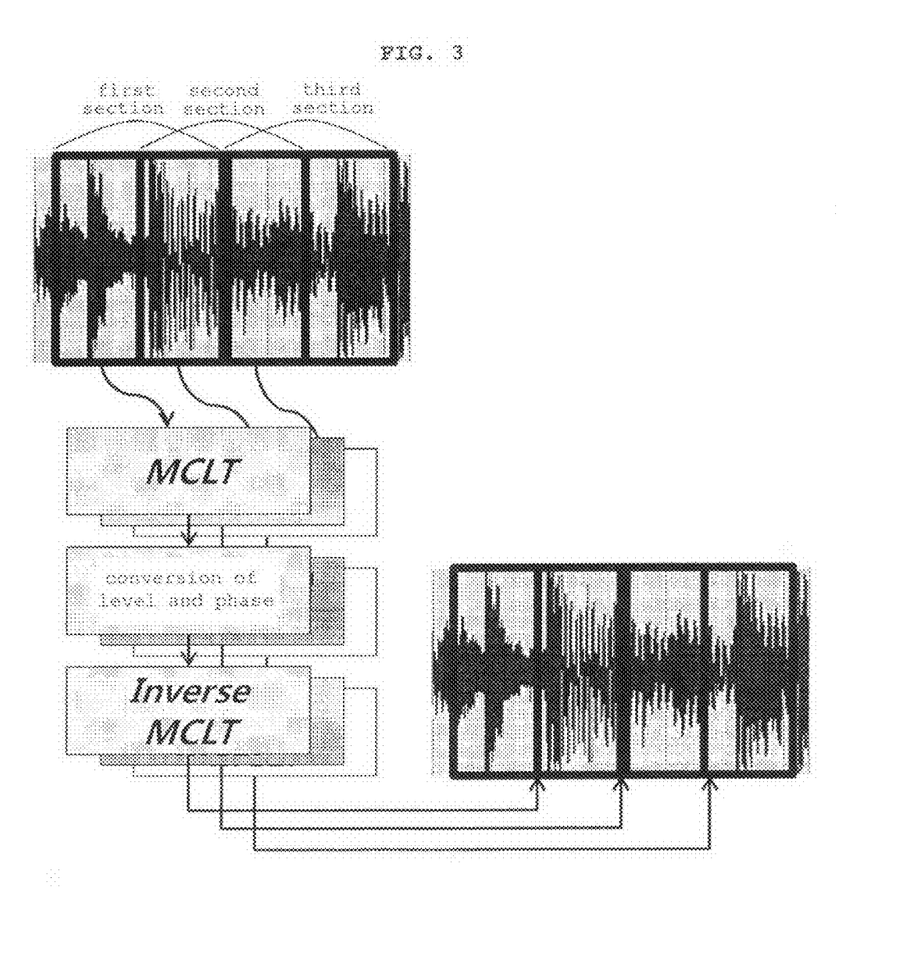
FIG. 3 is a schematic view showing the frequency-axis transform or the time-axis inverse transform performed in a specific section of an audio signal by a data input unit shown in FIG. 1.

FIG. 3 is a schematic view showing the frequency-axis transform or the time-axis inverse transform performed in the specific section of the audio signal by the data input unit 100 shown in FIG. 1. As shown in FIG. 3, the data input unit 100 receives the audio signal by dividing the audio signal into several sections and sequentially transforms the sections of the audio signal. For instance, the data input unit 100 transforms a primary input signal having a length of 2M and then transforms a secondary input signal, which has a length of 2M and proceeds by a length of 1M from the primary input signal, so that the primary input signal overlaps with the second input signal, thereby reducing the error when the signal is transformed.

In more detail, the frequency-axis transform part 110 of the data input unit 100 transforms the first section of the time-axis signal into the frequency-axis signal, transforms the second section, which overlaps with the first section by a predetermined level, into the frequency-axis signal, and then transforms the $N^{th}$ section, which overlaps with the second section by a predetermined level, into the frequency-axis signal.

After that, the frequency conversion part 120 inputs the data based on the frequency-axis signal corresponding to the first section, inputs the data based on the frequency-axis signal corresponding to the second section, and then inputs the data based on the frequency-axis signal corresponding to the $N^{th}$ section.

Then, the time-axis inverse transform part 130 inversely transforms the frequency-axis signal corresponding to the first section into the time-axis signal, inversely transforms the frequency-axis signal corresponding to the second section into the time-axis signal, and then inversely transforms the frequency-axis signal corresponding to the $N^{th}$ section into the time-axis signal in such a manner that the sections of the signal can be overlapped with each other, thereby generating the audio signal including the data.

Figure 4:
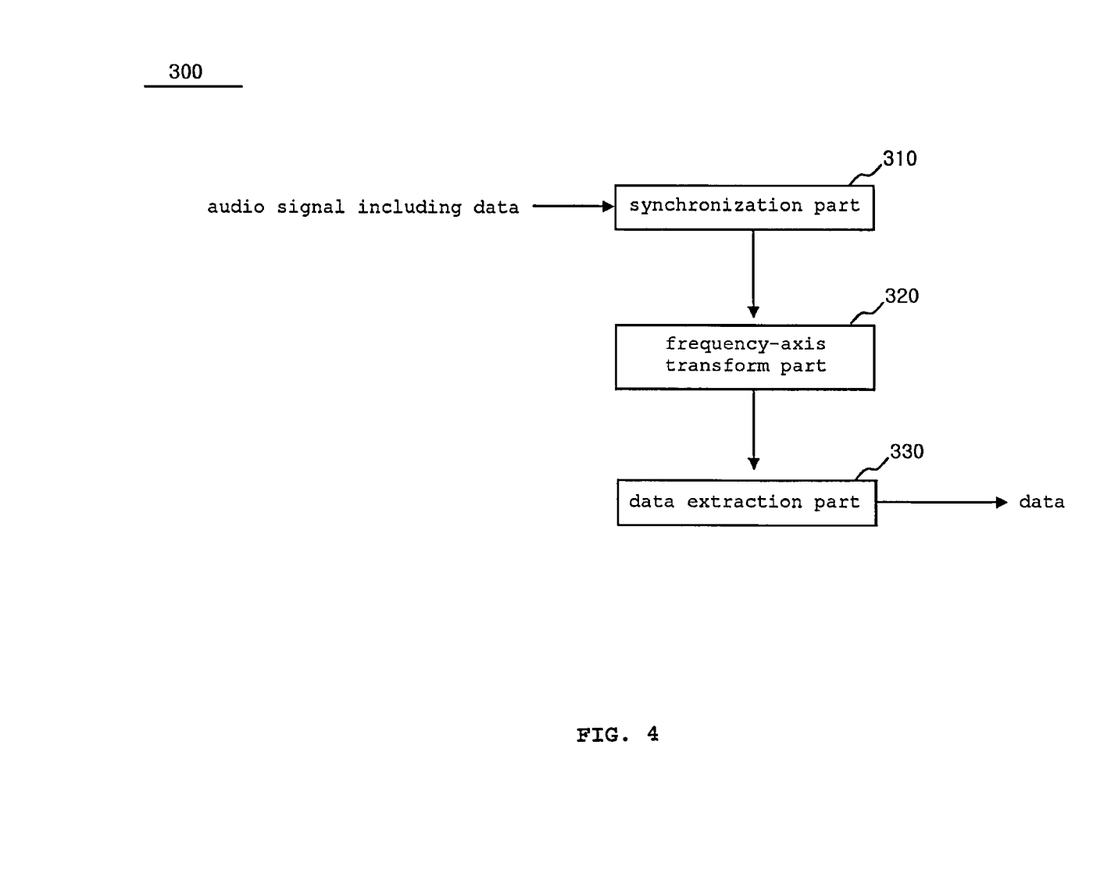
FIG. 4 is a view showing an execution procedure of a receiving unit shown in FIG. 1.

FIG. 4 is a view showing the execution procedure of the receiving unit 300 shown in FIG. 1. As shown in FIG. 4, the receiving unit 300 performing the acoustic communication includes a synchronization part 310 for performing synchronization through the matched filtering by receiving the audio signal including the data from the transmitting unit 200, a frequency-axis transform part 320 for transforming a time-axis signal of the audio signal including the data into a frequency-axis signal of the audio signal, and a data extracting part 330 which selects the frequency band for data extraction based on the synchronization result and extracts the data through predetermined data extraction processing (in the case of MCLT, the data are checked by determining the phase of the MCLT transform coefficient).

Preferably, the receiving unit 300 further includes a program execution part to execute the application program corresponding to the data.

Figure 5:
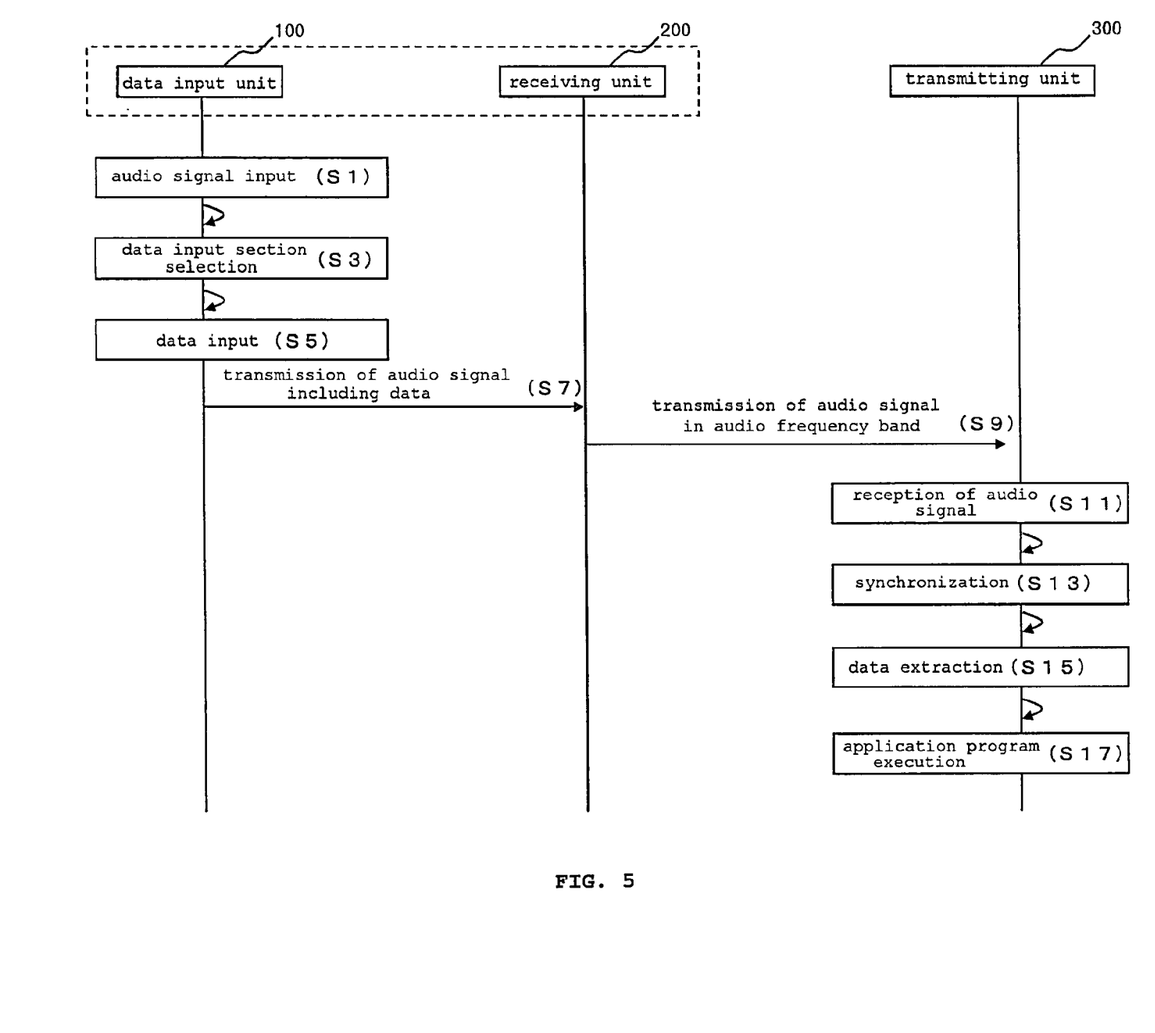
FIG. 5 is a flowchart showing the operation procedure of a data transceiving system in the audio frequency band shown in FIG. 1.

FIG. 5 is a flowchart showing the operation procedure of a data transceiving system in the audio frequency band shown in FIG. 1. As shown in FIG. 5, the method for transceiving the data in the audio frequency band includes the steps of converting the time-axis signal into the frequency-axis signal by receiving the audio signal and selecting the frequency band to input the data for the acoustic communication (S1 and S3). Then, the application program is executed to utilize the extracted data (S17).

Then, the level and the phase of the transform coefficient of the subject frequency, which corresponds to the frequency band to input the data, is converted according to the formation of the data, and then the data input is performed (S5).

The audio signal including the data formed through step S5 is transmitted to the transmitting unit 200 so that the audio signal is transmitted in the audio frequency band through the transmitting unit 200 (S7 and S9).

The receiving unit 300 receives the audio signal including the data of the audio frequency band by using a microphone, and performs the synchronization (S11 and S13).

After that, the sections including the data are determined based on the synchronization result and the data are extracted from the sections by detecting the phase (S15).

Then, the application program is executed to utilize the extracted data.

Hereinafter, the data transceiving system in the audio frequency band according to another embodiment of the present invention will be described in detail.

The data transceiving system in the audio frequency band according to another embodiment of the present invention includes a data input unit to input data for the acoustic communication into several sections of the audio signal, a transmitting unit for transmitting the audio signal including the data in the audio frequency band, and a receiving unit that receives the audio signals including the data and performs the synchronization of the audio signals by performing the matched filtering using a matched filter in order to extract the data from data input sections, which are selected through the synchronization, according to the predetermined extraction processing.

The data input unit may be integrally formed with the transmitting unit or may be separated from the transmitting unit. If the data input unit is integrally formed with the transmitting unit, it is suitable for transmitting the audio signal including the data through the radio broadcasting. If the data input unit is separated from the transmitting unit, it is suitable for reproducing the storage medium storing the audio signal including the data through the audio system installed in the vehicle.

Figure 6:
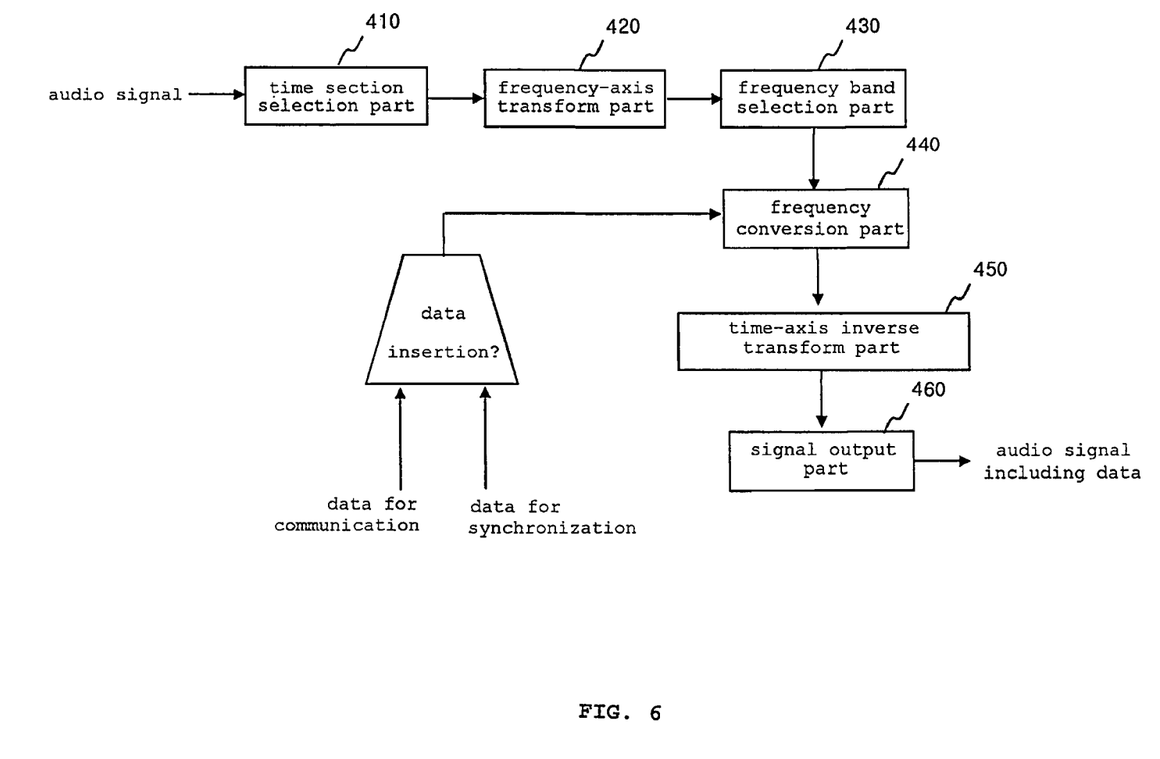
FIG. 6 is a block view showing the structure of a data transmitting device for the acoustic communication according to one embodiment of the present invention.

FIG. 6 is a block view showing the structure of a data transmitting device for the acoustic communication according to one embodiment of the present invention. As shown in FIG. 6, the data transmitting device for the acoustic communication includes a frequency-axis transform part 420 for transforming the time-axis signal of the audio signal into the frequency-axis signal by using various transform tools, such as MCLT, DFT and DCT, a frequency band selection part 430 which establishes a group section having a predetermined frequency range based on the frequency-axis signal and selects the frequency band to input the data for the acoustic communication according to the band selection reference (for instance, a level of the power intensity of the group section), a frequency conversion part 440 which converts the subject frequency according to the formation of the data if there is the frequency band satisfying the band selection reference, and a time-axis inverse transform part 450 for inversely transforming the frequency-axis signal into the time-axis signal to generate the audio signal including the data.

Preferably, the data transmitting device for the acoustic communication further includes a signal output part 460 for transmitting the audio signal including the data to the receiving unit in the audio frequency band.

Meanwhile, the data transmitting device for the acoustic communication may further include a time section selection part 410 to determine time sections having the level suitable for inputting the data based on the power intensity of each section of the time-axis signal of the audio signal.

Preferably, the time section selection part 410 selects the time sections to input the time before the time-axis signal of the audio signal is transformed into the frequency-axis signal by the frequency-axis transform part 420. If the frequency band selection part 430 determines that there is no frequency band suitable for the band selection reference, the time section selection part 410 reselects the time sections to input the data with respect to the time-axis signal, which is newly input after a predetermined time has elapsed.

If the time section selection part 410 reselects the time sections to input the data because there is no frequency band suitable for the band selection reference, the frequency-axis conversion and the selection of the frequency band is further performed.

The term "group section" signifies at least one frequency group including frequencies having continuous or discontinuous frequency coefficients.

The frequencies having the discontinuous frequency coefficients may have frequency components exceeding a predetermined level.

If the group section includes a first frequency group, a second frequency group and an $N^{th}$ frequency group, the frequency band selection part 430 determines whether the band selection reference is satisfied by primarily selecting the highest frequency group from among the first frequency group, the second frequency group and the $N^{th}$ frequency group, because the sound quality may be less degraded if the data insertion is performed under the high frequency condition.

In addition, the frequency band selection part 430 calculates the total power intensity of the first frequency group, the second frequency group or the $N^{th}$ frequency group and determines whether the band selection reference is satisfied based on the calculation result to determine the frequency band for inputting the data. Further, the frequency band selection part 430 calculates the power intensity of each frequency of the first frequency group, the second frequency group and the $N^{th}$ frequency group to determine at least one frequency satisfying the band selection reference based on the calculation result. In this case, the determined at least one frequency is selected as a frequency band to distributively input the data.

The frequency conversion part 440 readjusts the level of the transform coefficient based on the frequency signal boundary defined by power intensity of subject frequencies in the selected frequency sections to reduce the distortion of the audio signal below a predetermined level.

The level of the transform coefficient can be adjusted based on the masking threshold value, which is predetermined as a limit value based on the psychoacoustic model. If the level of the transform coefficient is lower than the masking threshold value, the intensity of the signal is amplified to the extent of the masking threshold value in such a manner that the noise may not be audible to people and the acoustic communication performance can be improved.

Figure 7:
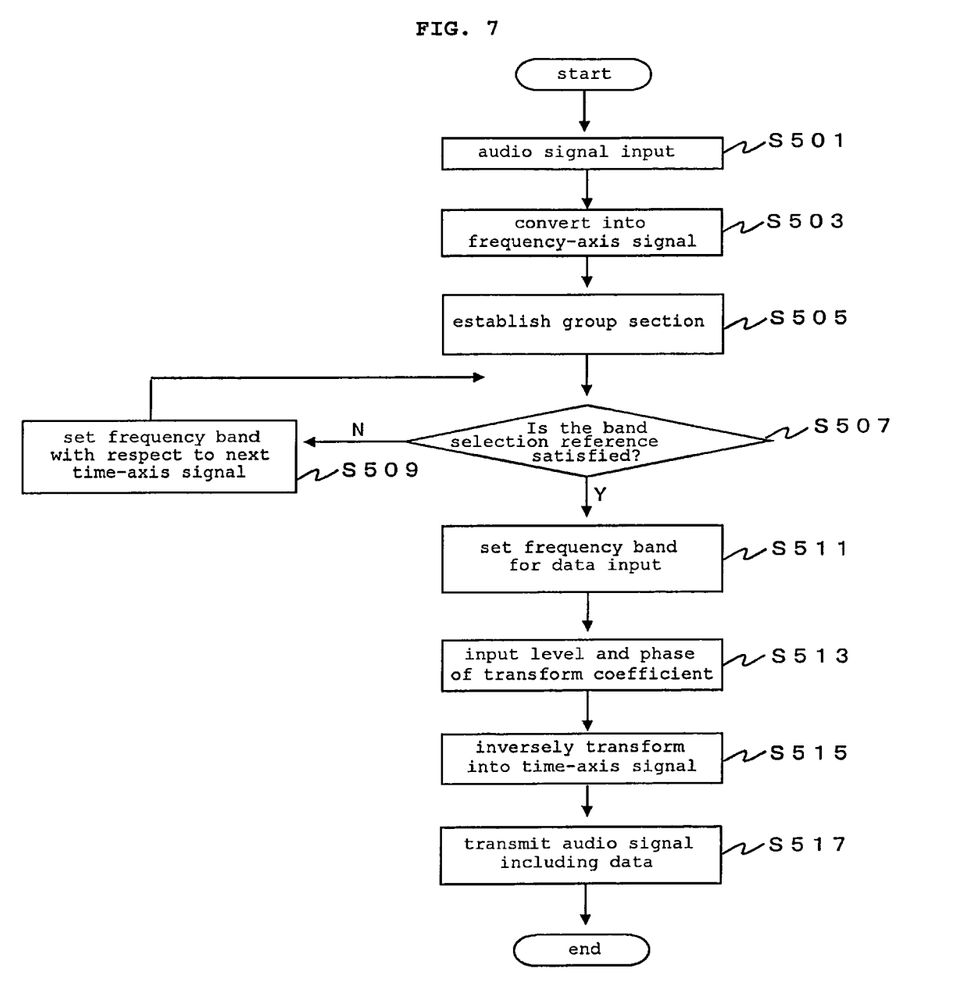
FIG. 7 is a flowchart showing the operation procedure of a data transmitting device for the acoustic communication shown in FIG. 6.

FIG. 7 is a flowchart showing the operation procedure of a data transmitting device for the acoustic communication shown in FIG. 6. As shown in FIG. 7, the method of transmitting data for the acoustic communication includes the steps of transforming the time-axis signal of the audio signal into the frequency-axis signal (S501 and S503).

In addition, the method includes the steps of establishing the group section having a predetermined frequency range based on the frequency-axis signal and selecting the frequency band satisfying the band selection reference to input the data for the acoustic communication by checking whether the power intensity is higher than a predetermined level (S505 and S507).

In step 507, if there is no frequency group satisfying the band selection reference in the group section, the next time-axis signal of the audio signal is input and it is determined whether the next time-axis signal of the audio signal satisfies the band selection reference (S509).

In step 507, if there are frequency groups satisfying the band selection reference in the group section, the frequency groups are selected as the frequency band to input the data, and the subject frequency corresponding to the frequency band to input the data is converted according to the formation of the data (S511 and S513).

After that, the frequency-axis signal is inversely transformed into the time-axis signal to generate the audio signal including the data and the audio signal is transmitted in the audio frequency band (S515 and S517).

Figure 8:
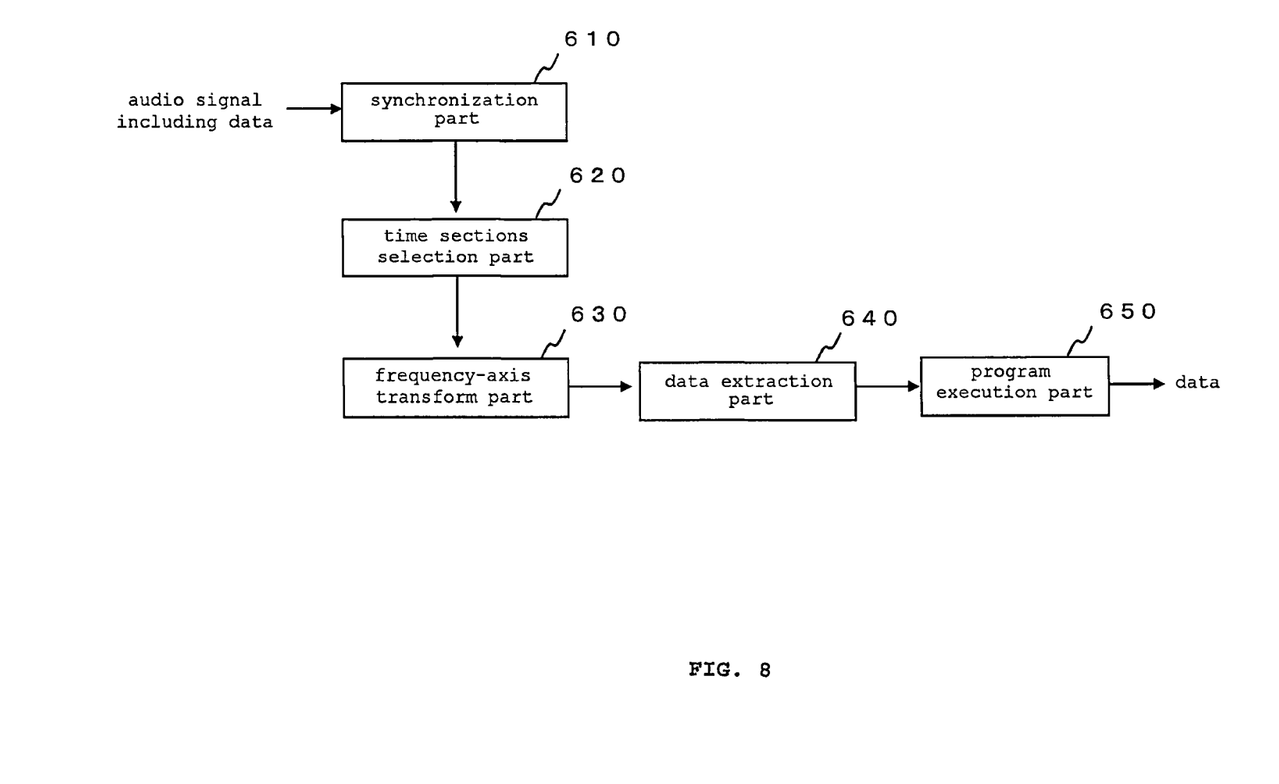
FIG. 8 is a block view showing the structure of a data receiving device for the acoustic communication according to one embodiment of the present invention.

FIG. 8 is a block view showing the structure of a data receiving device for the acoustic communication according to one embodiment of the present invention. As shown in FIG. 8, the data receiving device includes a synchronization part 610 receiving the audio signal including the data from the transmitting device to perform the synchronization through the matched filtering, a time section selection part 620 for selecting the time section including the data from among the time sections of the synchronized audio signal, a frequency-axis transform part 630 for transforming the time-axis signal of the time section including the data into the frequency-axis signal, a data extraction part 640 selecting the frequency band for extracting the data from the frequency-axis signal to extract the data according to the predetermined data extraction processing, and a program execution part 650 for executing application programs corresponding to the data.

The time section selection part 620 selects the time section including the data based on the insertion position of the synchronization data, or receives guide information for the time section including the data to discriminate the time section including the data.

In addition, the data extraction processing detects the phase of the subject frequencies constituting the frequency-axis signal and selects the frequency band for the data extraction if the phase of the subject frequencies is the predetermined phase (for instance, when BPSK is used, if the detected phase is 0 or $\pi$, there is high possibility of data, and if the detected phase is not 0 or $\pi$, there is low possibility of data.

Figure 9:
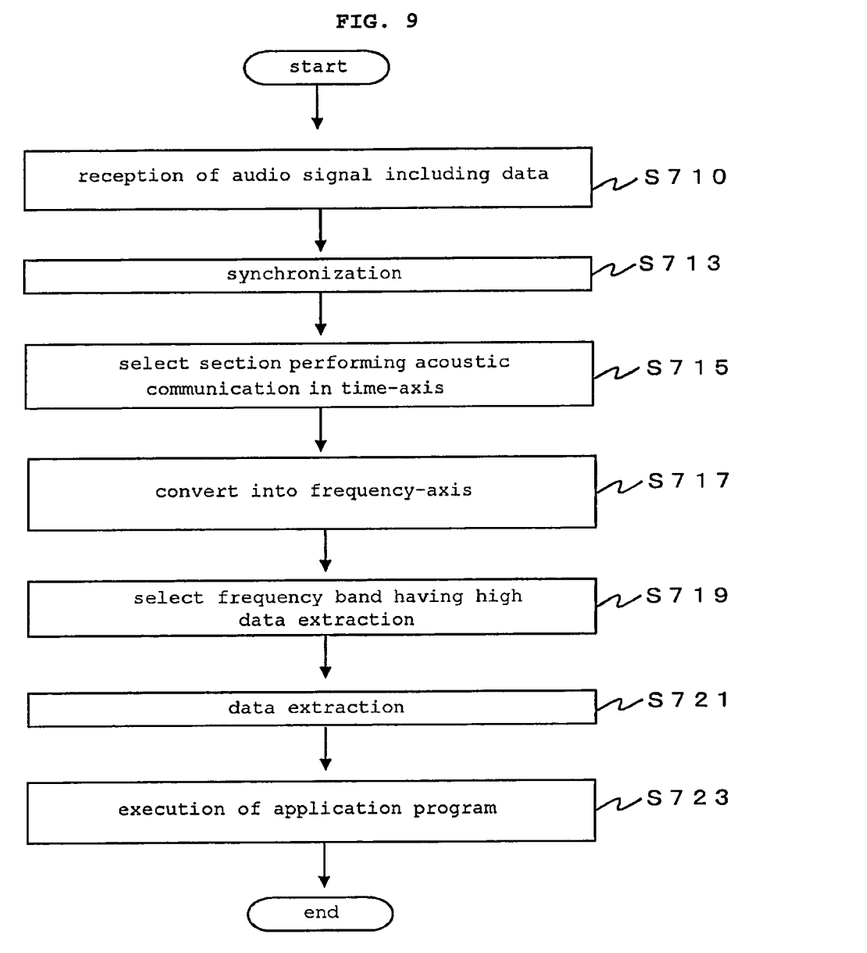
FIG. 9 is a flowchart showing the operation procedure of a data receiving device for the acoustic communication shown in FIG. 8.

FIG. 9 is a flowchart showing the operation procedure of the data receiving device for the acoustic communication shown in FIG. 8. As shown in FIG. 9, the method of receiving the data for the acoustic communication includes the steps of receiving the audio signal including the data and performing the synchronization through the matched filtering (S710 and S713).

Then, the time section having the highest possibility of the data is selected from among the time sections of the synchronized audio signal (S715), and performs the frequency-axis transform with respect to the selected time section (S717).

Then, the frequency band for extracting the data is selected based on the frequency-axis signal (S719), and the data are extracted by detecting the phase (S721).

After that, the application program corresponding to the extracted data is driven to output the data (S723).

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

Industrial Applicability

According to the present invention, the data to be transmitted are added to the audio signal and the audio signal is transmitted in the audio frequency band, thereby realizing the acoustic communication in the audio frequency band. Thus, the present invention has a high degree of industrial applicability in various fields.

The invention claimed is:

1. A system for transceiving data in an audio frequency band, the system comprising:
   a data input unit to input audio signal data including additional data for acoustic communication as a time axis audio signal,
   wherein the data input unit divides the time axis audio signal into a plurality of N sections and comprises;
   a frequency-axis transform part for transforming each of N sections of the time axis audio signal into a frequency-axis signal with each transformed section overlapping the preceding transformed section by a predetermined level;
   a frequency band selection part which selects a frequency band to establish a group section having a predetermined frequency range based on the frequency axis signal so as to input the data including the additional data for the acoustic communication according to the frequency band selection;
   a frequency conversion part that converts a subject frequency corresponding to the selected frequency band to input the data including the additional data according to formation of the data; and
   a time-axis inverse transform part to inversely transform the frequency-axis signal into the time-axis signal to generate the audio signal including the additional data, with said system further comprising;
   a data transmitting device including a time section selection part to determine time sections having a level suitable for inputting the data including the additional data based on the power intensity of each of the N sections of the time axis signal and a signal output part for transmitting the audio signal including the additional data in the audio frequency band and with the system further comprising;
   a receiving that receives the audio signal including the additional data and performs synchronization of the audio signal through a matched filtering and extracts the additional data according to predetermined extraction processing.

2. The system of claim 1, wherein the time section selection part selects the time sections to input the time before the time-axis signal is transformed into the frequency axis signal.

3. A data receiving apparatus for acoustic communication, the data receiving apparatus comprising:
   a synchronization part receiving an audio signal including additional data to perform synchronization through a matched filtering;
   a time section selection part to select a time section including the additional data from among time sections of the synchronized audio signal by extracting synchronization data from the audio signal including the additional data and detecting an insertion position of the synchronization data;
   a frequency-axis transform part to transform a time-axis signal of the time section including the additional data into a frequency-axis signal; and
   a data extracting part comprising:
   a frequency conversion part that selects a frequency band to input data including the additional data for acoustic communication based on the frequency-axis signal by determining a phase of a plurality of subject frequencies constituting the frequency-axis signal and selecting a subject frequency having the phase corresponding to a preset phase as the selected frequency band for data extraction; and
   a time-axis inverse transform part to inversely transform the frequency-axis signal into the time-axis signal to generate the audio signal including the additional data for data extraction based on the frequency-axis signal, with said data extraction part extracting the data including the additional data through predetermined data extraction processing.

4. The data receiving apparatus of claim 3, further comprising a program execution part to execute application programs corresponding to the data.

5. The data receiving apparatus of claim 3, wherein the synchronization data are located at a start frame of the time section including the additional data or located corresponding to at least two grouped start frames.

6. The data receiving apparatus of claim 3, wherein the time section selection part separately receives guide information for the time section including the additional data to determine the time section including the additional data.

7. The data receiving apparatus of claim 6, wherein the time section selection part receives the guide information through a communication channel used to receive the audio signal including the additional data, or another communication channel different from the communication channel used to receive the audio signal including the additional data.

8. A method of transceiving data for acoustic communication, the method comprising the steps of:
   inputting audio data including additional data for acoustic communication into an audio signal, with the data input step comprising;
   transforming a time-axis signal of the audio signal into a frequency-axis signal without conversion of the audio signal to a digital signal;
   establishing a group section including a plurality of N frequency groups
   selecting a frequency band from the plurality of N frequency groups having a predetermined frequency range based on the frequency axis signal so as to input the data including the additional data for the acoustic communication according to the frequency band selection;
   calculating the power intensity of each frequency in each group;
   determining the frequency band for data input by checking whether the calculated power intensity is higher than a predetermined level;

converting a subject frequency corresponding to the selected frequency band to input the data and additional data according to formation of the data;

inversely transforming the frequency-axis signal into the time-axis signal to generate the audio signal including the additional data, and with said method further comprising;

determining time sections having a level suitable for inputting the data including the additional data based on the power intensity of each of the N sections of the time axis signal and a signal output part for transmitting the audio signal including the additional data in an audio frequency band;

receiving the audio signal including the additional data to perform synchronization through a matched filtering; and extracting the data by detecting the phase of the subject frequencies constituting the frequency-axis signal and selecting the frequency band for data extraction based on the detected phase.

9. The method of claim 8, further comprising a step of executing an application program corresponding to the data.

* * * * *